(12) United States Patent
Das et al.

(10) Patent No.: US 6,590,431 B1
(45) Date of Patent: Jul. 8, 2003

(54) MAINTAINING SUBSTANTIALLY CONSTANT TRANS-CONDUCTANCE WITHOUT SUBSTANTIALLY CHANGING POWER CONSUMPTION

(75) Inventors: Abhijit Kumar Das, Bangalore (IN); Srinivasan Venkatraman, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/170,431

(22) Filed: Jun. 14, 2002

(51) Int. Cl.[7] .............................................. H02M 11/00
(52) U.S. Cl. ...................... 327/103; 330/305; 327/544
(58) Field of Search ............................ 327/60, 72, 103, 327/198, 336, 374–379, 544, 564; 330/307, 305, 252, 253

(56) References Cited

U.S. PATENT DOCUMENTS 6,346,856 B1 * 2/2002 Myers et al. ............... 330/252
6,407,658 B2 * 6/2002 Kuo ........................... 327/552
6,480,064 B1 * 11/2002 Cyrusian .................... 330/253

OTHER PUBLICATIONS

Srinivasan Venkatraman, Srikanth Natarajan and K. Radhakrishna Rao; Entitled; A New Tuning Scheme for Continuous Time Filters;VLSI Design, 1998 Proceedings, 1998 Eleventh International Conference; pp. 150–154;(5 pages).

* cited by examiner

Primary Examiner—My-Trang Nuton
(74) Attorney, Agent, or Firm—J. Dennis Moore; W. James Brady, III; Frederick J. Telecky, Jr.

(57) ABSTRACT

The current passing in a main trans-conductor circuit is compared in analog domain with a reference current. If the passing current exceeds the reference current, another trans-conductor circuit may be switched on to cause the effective area of trans-conductor circuits to be increased. Using such a feature, the trans-conductance value may be maintained substantially constant without substantially increasing power.

27 Claims, 3 Drawing Sheets

MAINTAINING SUBSTANTIALLY CONSTANT TRANS-CONDUCTANCE WITHOUT SUBSTANTIALLY CHANGING POWER CONSUMPTION

BACKGROUND OF THE INVENTION

1. Field of the Invention

The present invention relates to integrated circuits (IC), and more specifically to a method and apparatus for maintaining substantially constant trans-conductance value (for the contained transistors) without a substantial change in power consumption in the ICs.

2. Related Art

Integrated circuits are often used to implement components such as filters, amplifiers, etc. Typical integrated circuits are implemented using components such as trans-conductor circuits, which are characterized by trans-conductance. Trans-conductance generally is a measure of the responsiveness (degree of change) of current at an output to a change in the voltage at the input of a trans-conductor circuit as is well known in the relevant arts.

It is often desirable to maintain the trans-conductance of trans-conductor circuit s constant as is well known in the relevant arts. However, trans-conductance often changes during operation of integrated circuit due to reasons such as surrounding temperature and/or absence of manufacturing technology to attain a desired precision. Substantial changes in the trans-conductance value may be undesirable at least in some environments. Accordingly, it may be desirable to change the trans-conductance to revert back close to the original value.

One approach to changing the trans-conductance value of the MOS transistors based implementations is to change the voltage level Von (which equals (Vgs–Vt), wherein Vgs is the Gate To Source Voltage & Vt is the threshold voltage of the MOS) as is well known in the relevant arts. However, a problem with such an approach is that the electrical power consumed by the integrated circuit may increase substantially. Such increases in power consumption may be undesirable in many environments.

What is therefore required is, method and apparatus for controlling power in integrated circuits based on trans-conductor circuits.

SUMMARY OF THE INVENTION

The present invention allows a substantially constant trans-conductance value to be maintained associated with a trans-conductor circuit without a substantial increase in the electric power consumed by an integrated circuit containing the trans-conductor circuit. In an embodiment, the trans-conductor circuit is implemented using metal-oxide-semiconductor (MOS) transistors in which the trans-conductance value is given by the equation:

$$Gm = \mu^* C_{OX}^* W/L^* V_{ON} \quad \text{Equation (1)}$$

wherein 'Gm' represents the trans-conductance value, '$\mu$' represents the mobility of holes/electrons in the transistor used to implement a trans-conductor circuit, '$C_{OX}$' represents the channel capacitance per unit area of the transistor, 'W' represents the width of the transistor, 'L' represents the length of the transistor, and * represents a multiplication operation.

$V_{ON}$ in turn may be represented by the following equation:

$$V_{ON} = V_1 - V_3 - V_T \quad \text{Equation (2)}$$

wherein '$V_1$' represents the voltage level at the gate terminal of the MOS transistor, '$V_3$' represents the voltage level at the source terminal of the MOS transistor, and $V_T$ is a threshold voltage of the MOS transistor.

The trans-conductance of a trans-conductor circuit ("main trans-conductor circuit") may decrease (change in general) when external factors such as temperature increases. The trans-conductance value may be increased to its original value by increasing '$V_{ON}$'. The electrical current flowing may also increase according to the following equation:

$$\text{Electrical Current} = K^* W/L^* Von^2, \text{ wherein } K = \mu^* COX \quad \text{Equation (3)}$$

The increase in current leads to an increase in electrical power and may thus be undesirable. It may be noted that the power consumption increases proportionate to a square of Von.

According to an aspect of the present invention, an amount of current flowing in the circuit is compared with a reference current to determine whether the amount of current exceeds the reference current. The comparison is performed using an analog form of the reference current and the current in said integrated circuit.

Due to the comparison in analog form, an integrated circuit may be implemented using a fewer components. Usage of fewer components generally results in lower power consumption and lower noise.

If the current in the integrated circuit exceeds the reference current, an additional trans-conductor circuit is added which effectively increases the W/L of the MOS and hence the trans-conductance can be kept constant without changing Von. Von can then potentially be reduced (tuned) to attain a constant trans-conductance value.

Thus, in effect, a constant value of trans-conductance can be attained by increasing W/L instead of increasing Von. As the power consumption is proportionate to the square of Von, minimizing Von generally leads to substantial reduction in power consumption.

In an embodiment, the determination of whether the trans-conductance value has changed (warranting switching on of the additional trans-conductor circuit) is performed using one more trans-conductor circuit ("replica trans-conductor circuit"), which is implemented to have similar characteristics ("transfer function" in terms of converting voltage to current) as the operational trans-conductor circuit(s).

The replica trans-conductor may be operated using a D.C. voltage to determine whether the trans-conductance value has changed. Based on the determination in the replica trans-conductor circuit, the another trans-conductor circuit may be switched on/off.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

An aspect of the present invention allows maintaining a substantially constant trans-conductance value in trans-conductor circuits based integrated circuits, while potentially preventing substantial increases in the consumption of electrical power. In general, when the trans-conductance value decreases (due to factors such as temperature increase), substantially constant trans-conductance may be achieved by increasing the voltage Von of a trans-conductor circuit ("main trans-conductor circuit").

The resulting increase in power consumption can be countered by activating additional trans-conductor circuits to be coupled operationally to the main trans-conductor circuit, which increases the effective trans-conductance of the two trans-conductors together. The voltage Von can then be decreased (tuned) to attain an acceptable desired trans-conductance, which in turn decrease the total power consumption. As the total power consumed is proportionate to the square of Von, substantial reductions in power consumption may be attained.

Several aspects of the invention are described below with reference to example systems for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example System

Figure 1:
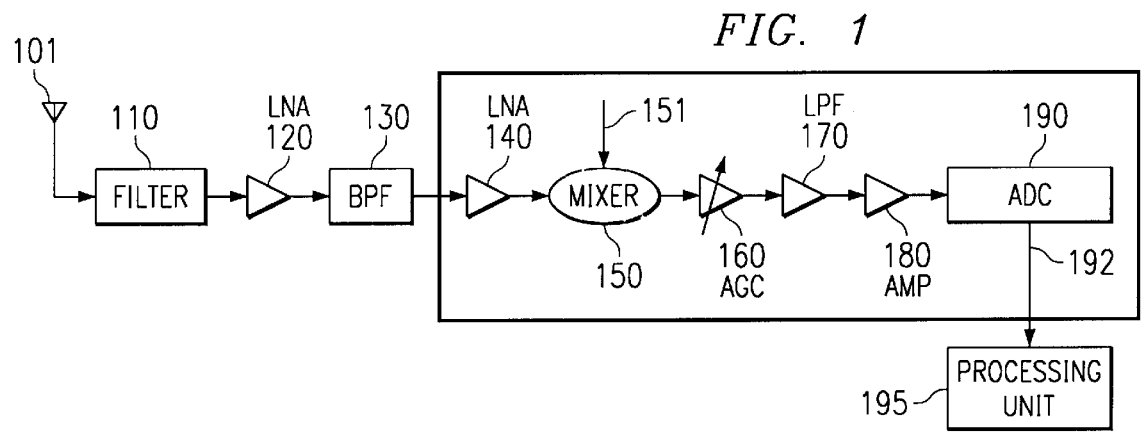
FIG. 1 is a circuit diagram illustrating the details of an example device in which the present invention may be implemented.

FIG. 1 is a block diagram of receiver system 100 illustrating an example system in which the present invention may be implemented. For illustration, it is assumed that receiver system 100 is implemented within a Global Positioning System Receiver. However, receiver system 100 can be implemented in other devices (e.g., mobile phone, etc.) which generally require low power consumption.

Receiver system 100 is shown containing antenna 101, filter 110, low noise amplifiers (LNA) 120 and 140, band pass filter 130, mixer 150, automatic gain controller 160, filter circuit 170, amplifier 180, analog to digital converter (ADC) 190, and processing unit 195. Each component is described in further detail below.

Antenna 101 may receive various signals transmitted from satellites, etc. The received signals may be provided to filter 110. Filter 110 may perform a corresponding transfer function to generate signals of the frequencies of interest. The generated signals are provided to LNA 120. Antenna 101 and filter 110 may be implemented in a known way.

LNA 120 amplifies the signals received on line 112 to generate a corresponding amplified signal on line 123. Band pass filter (BPF) 130 may filter the amplified signal to remove any noise components that may be present. The filtered signal thus generated may be provided to LNA 140. LNA 140 may again amplify the filtered signals and provide the amplified filtered signal to mixer 150. LNAs 120 and 140, and BPF 130 may also be implemented in a known way.

Mixer 150 may be used to convert a high frequency signal to a signal having any desired frequency. In an embodiment, a signal of frequency 1575 MHz is converted to a 4 Mhz signal. Mixer 150 may receive filtered amplified signal and a signal of fixed frequency as inputs. The signal (on path 151) of fixed frequency may be generated by a phase locked loop (not shown) in a known way.

Automatic gain control (AGC) 160 may be used to amplify or attenuate the signal (from mixer 150) according to various requirements. For example, if a user using a mobile phone is in an area where the signals received are of low strength, and AGC 160 amplifies the signal accordingly. Similarly, if the user moves to an area where the signal strength is relatively higher, AGC 160 may attenuate the signal.

Filter circuit 170 may remove any noise components present in the signal received on line 167 to generate a filtered signal. The filtered signal may be provided to amplifier 180. Amplifier 180 may further amplify the signal received on line 178 to generate an amplified signal. The amplified signal may be provided to analog to digital converter (ADC)190. It may be noted that all the above components of FIG. 1 operate on signals that are analog in nature.

ADC 190 converts the analog signal received on line 189 to a corresponding digital signal. The digital signal on line 192 may then be provided to processing unit 195 for further processing. In general, low noise amplifiers and filters used in receiver system 100 may be implemented using transistors. As described in the above sections, it is desirable to maintain a constant trans-conductance value for the trans-conductor circuits without at least substantially increasing the electrical power consumption in the integrated circuits. The basic relationship between electrical power and trans-conductance value is described below in further detail.

3. Relationship Between Trans-conductance and Electrical Power

Trans-conductance value of a trans-conductor circuit may be determined by using the following equation:

$$Gm = \mu * C_{OX} * W/L * V_{ON} \qquad \text{Equation (1)}$$

wherein 'Gm' represents the trans-conductance value, '$\mu$' represents the mobility of holes/electrons in a transistor used to implement a trans-conductor circuit, '$C_{OX}$' represents the channel capacitance per unit area of the transistor, 'W' represents the width of the transistor, 'L' represents the length of the transistor, and * represents a multiplication operation. $V_{ON}$ in turn may be represented by the following equation:

$$V_{ON} = V_1 - V_3 - V_T \qquad \text{Equation (2)}$$

wherein '$V_1$' represents the voltage level at the gate terminal of the MOS transistor, '$V_3$' represents the voltage level at the drain terminal of the MOS transistor, and $V_T$ is a threshold voltage of the MOS transistor.

As described in the above sections, the trans-conductance of a circuit may decrease (change in general) when external factors such as temperature increases. One way to increase the trans-conductance value is by increasing '$V_{ON}$' as may be appreciated by examining Equation (1).

One problem with increasing '$V_{ON}$' is that the electrical power consumed by the MOS transistor also increases as will be apparent from the following equation:

$$\text{Electrical Current} = K * V_{ON}^2 \qquad \text{Equation (3)}$$

wherein 'K' represents the result of '$\mu * C_{OX} * W/L$' in Equation (1). Thus, by increasing $V_{ON}$, the electrical power consumption of the trans-conductor circuit (and thus the integrated circuit containing the transistor) also increases. The manner in which the power consumption may be reduced is described with examples below.

4. Method

Figure 2:
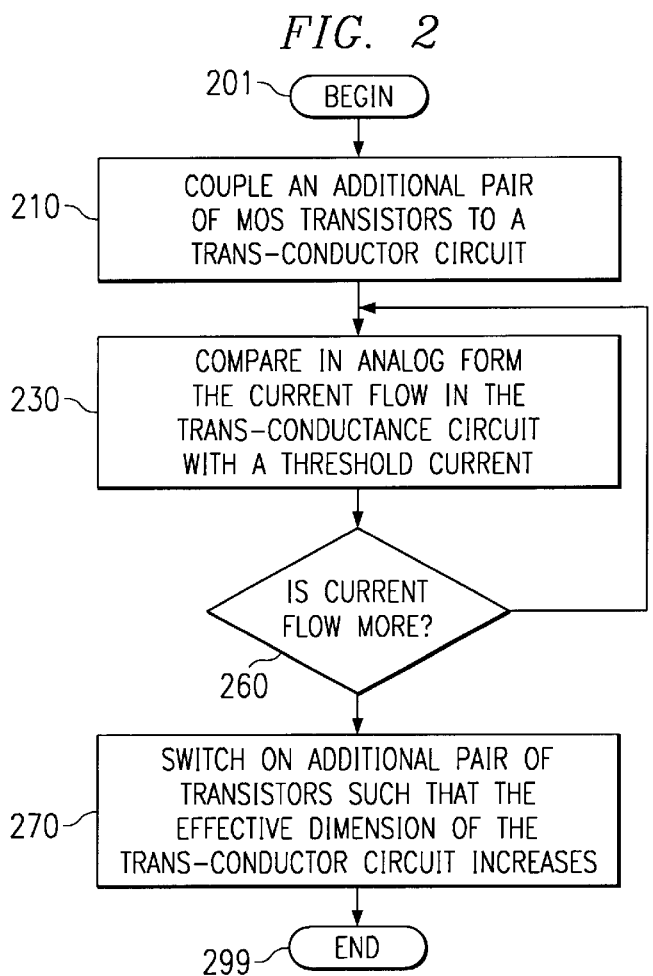
FIG. 2 is a flowchart illustrating a method in accordance with an aspect of the present invention.

FIG. 2 is a flow chart illustrating the manner in which the electrical power consumed by integrated circuits using trans-conductors may be reduced according to an aspect of the present invention. The method begins in step 201 in which control immediately passes to step 210.

In step 210, an additional trans-conductor may be coupled to a main trans-conductor within an integrated circuit. One of the two trans-conductors may be used in all configurations of the operation of the integrated circuit. For illustration, it is assumed that the main trans-conductor is used always.

In step 220, assuming for illustration that the trans-conductance value has decreased for reasons such as heat generated by the operation of the integrated circuit, the voltage Von may be increased to increase the trans-conductance value. The voltage may be increased in a known way.

In step 230, a determination is made as to whether the current flowing in the main trans-conductor circuit exceeds a reference current. The determination is made by comparing the two currents in analog form (domain). In an embodiment, a third trans-conductor circuit may be used to determine the reference current in the main trans-conductor circuit.

In step 260, a decision is made according to the comparison result of step 230. If the current flowing in the main trans-conductor circuit is more, control passes to step 270, else control passes to step 250. In step 270, the additional trans-conductor circuit is switched on so that the dimension of the effective trans-conductor circuit area within the integrated circuit increases. By increasing the dimensions of the effective trans-conductor circuit, the trans-conductance value of the integrated circuit increases.

In step 280, Von can again be decreased again if the trans-conducatance can be maintained within acceptable limits. As the power consumed by integrated circuits is proportionate to the square of voltage Von, reduction in Von can lead to substantial reduction in the electrical power consumed by the integrated circuits.

Thus, by increasing the effective trans-conductance (conductor) area, an aspect of the present invention enables one to maintain substantially constant Gm without increasing the overall electric power consumption. The description is continued with reference to an example circuit implemented in accordance with an aspect of the present invention.

5. Example Circuit

Figure 3:
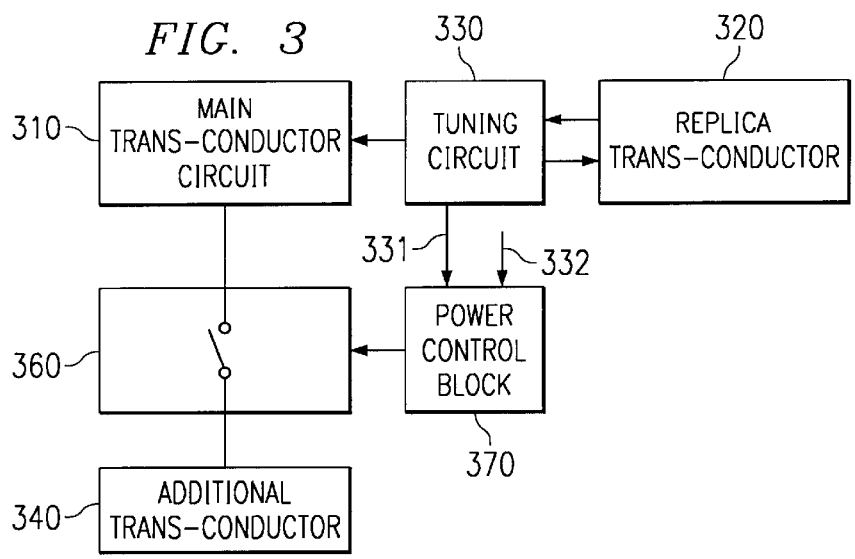
FIG. 3 is a block diagram illustrating the details of an embodiment of a circuit implemented in accordance with an aspect of the present invention.

FIG. 3 is a block diagram illustrating the details of an example circuit 300 implemented in accordance with the present invention. Circuit 300 may be used to implement, for example, one or more of LPF 170 and AMP 180 of FIG. 1. Circuit 300 is shown containing main trans-conductor circuit 310, replica trans-conductor circuit 320, tuning circuit 330, power control block 370 additional trans-conductor circuit 340, and switch block 360. Each component is described in further detail below.

Main trans-conductor circuit 310 may receive input signal with a voltage level of Vin and generate a corresponding output current. In an embodiment, main trans-conductor circuit 310 is implemented using PMOS transistors.

Additional trans-conductor circuit 340 may be coupled to differential trans-conductor circuit 310 when switch block 360 is turned on. By coupling additional trans-conductor circuit 340 to main trans-conductor circuit 310, the effective area increases ('W/L' of Equation (1)), thereby increasing the trans-conductance of differential trans-conductor circuit 310 as noted in equation (1).

Replica trans-conductor circuit 320 generates a current level representing the current level generated by main trans-conductor circuit 310 (together with additional trans-conductor circuit 340 if connected) for a similar voltage input. To achieve such a feature, replica trans-conductor circuit 320 may have similar characteristics (transfer function in converting voltage to current) as the activated trans-conductor circuits.

That is, when switch 360 is on/closed, replica trans-conductor circuit 320 operates similar to the combined trans-conductor circuits 310 and 340, and to just trans-conductor circuit 310 when switch 360 is off/open. The similar characteristics may be attained by using a similar layout and topology for replica trans-conductor circuit 320 as main trans-conductor circuit 310 and additional trans-conductor circuit 340.

Tuning circuit 330 determines whether to change the voltage Von to maintain a substantially constant trans-conductance value, and applies Von on the trans-conductor circuits accordingly. The determination may be performed periodically by applying a constant voltage to replica trans-conductor circuit 320, and examining the output current of the circuit. The determination may also be performed in any other known way.

Tuning circuit 330 changes the voltage Von across main trans-conductor circuit 310 according to the above determination. The voltage change is effected on replica trans-conductor circuit 320 as well. Thus, in operation, tuning circuit 330 may first cause the voltage Von to be gradually increased (if the trans-conductance of the main trans-conductor circuit is gradually decreasing) causing the additional trans-conductor circuit to be switched on. Tuning circuit 330 may then cause Von to be gradually decreased to attain a desired Gm, which in turn prevents the block from operating at high power level.

Power control block 370 may compare the current flowing on path 331 with a reference current on path 332. The current on path 331 may be generated by applying a pre-specified voltage as input to replica trans-conductor circuit 320. If the current on path 331 is more than the reference current on path 332, power control block 370 may turn on switch block 360 to activate additional trans-conductor circuit 340. The reference current is determined according to the power consumption levels at which it may be desirable to add additional trans-conductor circuit 340 and may be determined without undue experimentation as will be apparent to one skilled in the relevant arts. The power control block has a Hysteresis, which prevents the control voltage [going to the switch 360] from oscillating due to small changes in temperature.

Switch block 360 is turned on when the current in differential trans-conductor circuit 310 exceeds the reference current on path 332. When switch block 360 is turned on, additional trans-conductor circuit 340 may be coupled to differential trans-conductor circuit 310. The power consumption in integrated circuit 300 decreases as a result.

Thus, using the above approach, the trans-conductance of a circuit may be increased without substantially increasing the electrical power consumed. The description is continued with reference to the manner in which above circuit may be implemented.

6. Circuit Implementation

Figure 4:
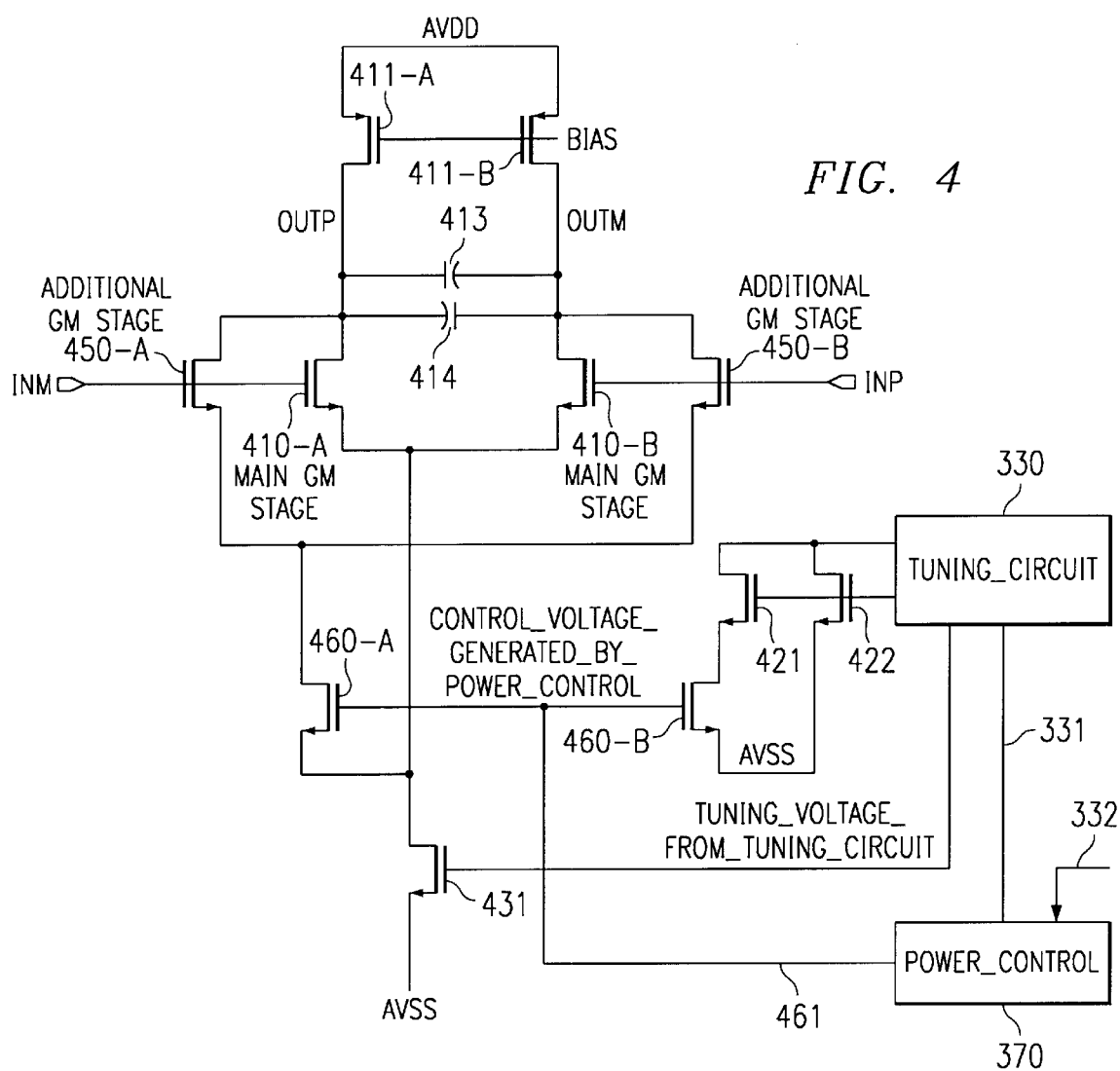
FIG. 4 is a circuit diagram illustrating in further detail an embodiment of the present invention.

FIG. 4 is a circuit diagram illustrating the details of implementation of an embodiment of circuit 300 of FIG. 3. FIG. 4 is shown containing nMOS transistors 410-A, 410-B, 421, 422, 431, 450-A, 450-B, 460-A, and 460-B, pMOS transistors 411-A and 411-B, capacitors 413 and 414, tuning circuit 330 and power control 370. Each component is described in further detail below.

nMOS transistors 410-A and 410-B together form main trans-conductor circuit 310 processing differential signals. The positive input signal is provided to gate terminal 409-A of nMOS transistor 410-A and negative input signal is provided to gate terminal 409-B of nMOS transistor 410-B. The output signal is generated across capacitors 413 and 414. PMOS transistors 411-A and 411-B are used to bias nMOS transistors 410-A and 410-B.

nMOS transistors 450-A and 450-B together form additional trans-conductor circuit 340, which are activated when nMOS transistor 460-A (which forms switch 360) is turned on. nMOS transistors 421 and 422 together form replica trans-conductor circuit 320. nMOS transistors 421 and 422 respectively mirror the additional and main trans-conductor circuits.

Tuning circuit 330 determines whether to increase (change) the trans-conductance value of the main trans-conductor circuit by interfacing with nMOS transistors 421 and 422. The determination may be performed in a known way.

In addition, tuning circuit 330 sends on path 331 an amount of current proportionate to the current that would be flowing in main trans-conductor circuit. The amount of current sent is determined again by interfacing with nMOS transistors 421 and 422. A pre-specified voltage may applied as an input to the replica trans-conductor circuit, and the resulting current may be sent on path 331 as noted above.

Power control 370 compares the current on path 331 with a reference current received on path 332 and generates a logical value on path 461 reflecting the result of the comparison. If the current on path 331 is more, then nMOS transistors 460-A and 460-B may be turned on due to the logical level on path 461. Power control 370 contains a comparator circuit to perform the comparison operation. Thus, it may be appreciated that the circuit of FIG. 3 maintains a substantially constant trans-conductance value without a substantial increase in power consumption.

While only one trans-conductor circuit is described as being added, it should be understood that multiple trans-conductor circuits may be designed to be added at different levels of power consumption. Replica trans-conductor circuit 320, tuning circuit 330 and power control 370 will need to be designed accordingly. The implementation of such alternative embodiments will be apparent to one skilled in the relevant arts based on the disclosure provided herein, and such alternative embodiments are contemplated to be within the scope and spirit of the present invention. The description is continued with reference to the manner in which an embodiment of power control 370 may be implemented.

7. Power Control

Figure 5:
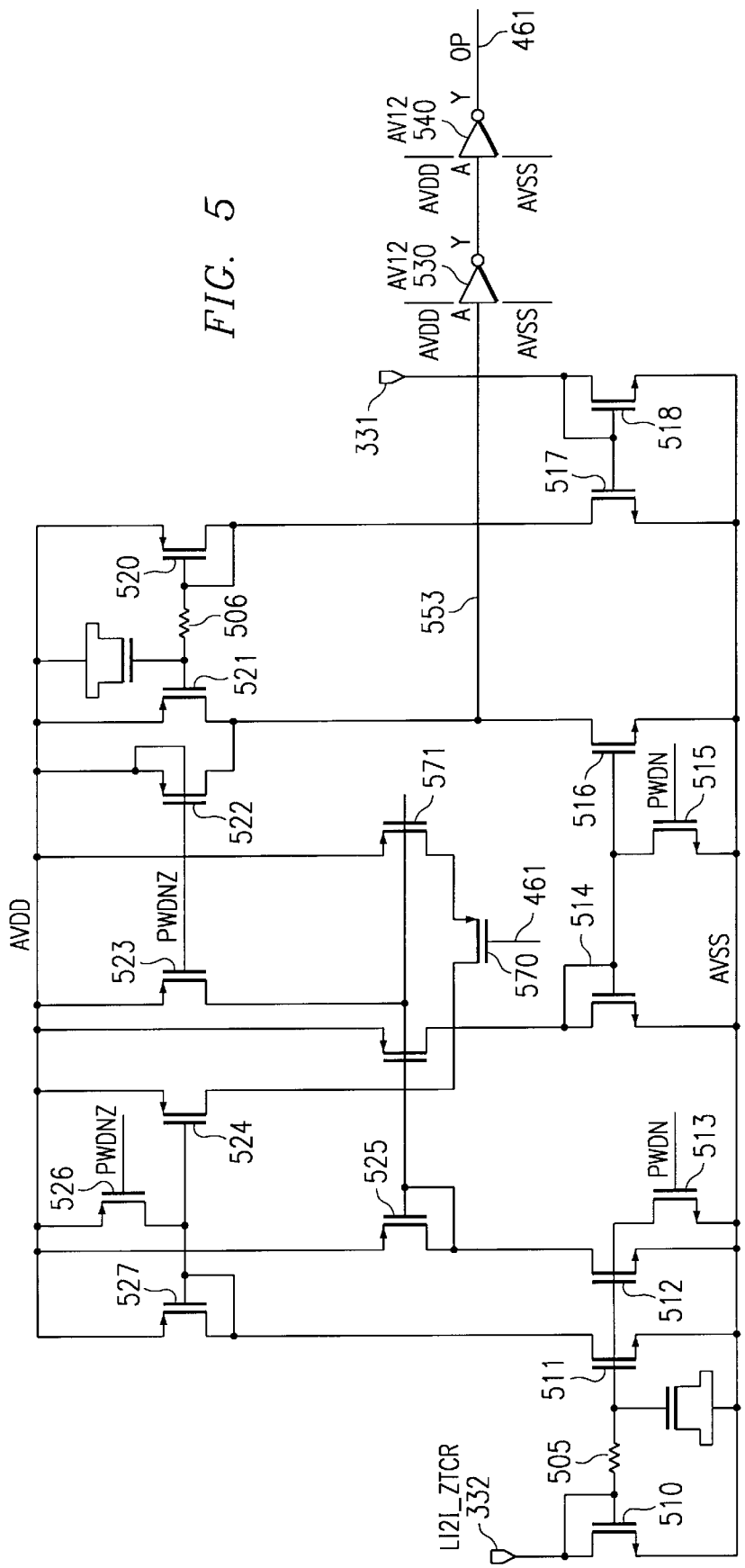
FIG. 5 is a circuit diagram illustrating an embodiment of a comparison circuit in an embodiment of the present invention.

FIG. 5 is a circuit diagram illustrating the implementation of an embodiment of power control 370. Power control 370 is shown containing nMOS transistors 510 through 518, pMOS transistors 520 through 527, resistors 505 and 506, and NOT gates (invertors) 530 and 540. Reference current on path 332 is shown provided to the drain terminal of nMOS transistor 510. The current generated by tuning circuit 330 (on path 331) is shown provided to nMOS transistor 518.

Transistors 521 and 516 compare the two input currents, and generate a result on path 553. Invertors 530 and 540 invert the result, and provide the final output on path 461. The remaining components of power control 370 implement hysterysis as will be apparent to one skilled relevant in the arts. Due to the implementation of hysterysis, the output on path 461 may not swing to different logical level in response to short fluctuations in the differences of the two input currents.

8. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of maintaining substantially constant trans-conductance without substantially changing power consumption in an integrated circuit, said method comprising:

increasing a voltage level associated with a main trans-conductor circuit contained in said integrated circuit to maintain said substantially constant trans-conductance, wherein said increasing causes said integrated circuit to consume more power;

comparing an amount of current in said integrated circuit with a reference current to determine whether said amount of current exceeds said reference current, wherein said comparing is performed on an analog form of said reference current and said current in said integrated circuit; and adding an additional trans-conductor circuit if said amount of current exceeds said reference current, wherein said adding reduces power consumed by said integrated circuit.

2. The method of claim 1, further comprising decreasing said voltage level after said adding, wherein said decreasing causes further reduction in power consumed by said integrated circuit.

3. The method of claim 2, wherein said amount of current is generated by a replica trans-conductor circuit having a transfer characteristic similar to that of said main trans-conductor circuit, wherein said increasing increases said voltage level associated with said replica trans-conductor circuit also.

4. The method of claim 3, further comprising:
computing a trans-conductance value of said replica trans-conductor circuit; and
performing said increasing if said trans-conductance value exceeds a pre-specified value.

5. The method of claim 4, wherein said trans-conductor circuit is implemented using a MOS transistor, and said voltage comprises Von which equals ($V_1-V_3-V_T$), wherein '$V_1$' represents the voltage level at the gate terminal of the MOS transistor, '$V_3$' represents the voltage level at the drain terminal of the MOS transistor, and $V_T$ is a threshold voltage of the MOS transistor.

6. The method of claim 5, wherein said trans-conductance value equals ($\mu*C_{OX}*W/L*V_{ON}$), '$\mu$' represents the mobility of holes/electrons in said MOS transistor, '$C_{OX}$' represents the channel capacitance of the transistor, 'W' represents the width of the MOS transistor, 'L' represents the length of the transistor, and * represents a multiplication operation, and wherein the power consumed by said trans-conductor circuit equals ($\mu*C_{OX}*W/L*Von^2$).

7. An integrated circuit comprising:
a main trans-conductor circuit having a trans-conductance;
means for increasing a voltage level associated with said main trans-conductor circuit to maintain said substantially constant trans-conductance, wherein said increasing causes said integrated circuit to consume more power;
means for comparing an amount of current in said integrated circuit with a reference current to determine whether said amount of current exceeds said reference current, wherein said comparing is performed on an analog form of said reference current and said current in said integrated circuit; and
means for adding an additional trans-conductor circuit if said amount of current exceeds said reference current, wherein said adding reduces power consumed by said integrated circuit.

8. The integrated circuit of claim 7, further comprising means for decreasing said voltage level after said adding, wherein said decreasing causes further reduction in power consumed by said integrated circuit.

9. The integrated circuit of claim 8, wherein said amount of current is generated by a replica trans-conductor circuit having a transfer characteristic similar to that of said main trans-conductor circuit, wherein said means for increasing increases said voltage level associated with said replica trans-conductor circuit also.

10. The integrated circuit of claim 9, further comprising:
means for computing a trans-conductance value of said replica trans-conductor circuit;
means for performing said increasing if said trans-conductance value exceeds a pre-specified value.

11. The integrated circuit of claim 10, wherein said trans-conductor circuit is implemented using a MOS transistor, and said voltage comprises Von which equals ($V_1-V_3-V_T$), wherein '$V_1$' represents the voltage level at the gate terminal of the MOS transistor, '$V_3$' represents the voltage level at the drain terminal of the MOS transistor, and $V_T$ is a threshold voltage of the MOS transistor,
wherein said trans-conductance value equals ($\mu*C_{OX}*W/L*V_{ON}$), '$\mu$' represents the mobility of holes/electrons in said MOS transistor, '$C_{OX}$' represents the channel capacitance of the transistor, 'W' represents the width of the MOS transistor, 'L' represents the length of the transistor, and * represents a multiplication operation, and
wherein the power consumed by said trans-conductor circuit equals ($\mu*C_{OX}*W/L*Von^2$).

12. An integrated circuit comprising:
a main trans-conductor circuit receiving an input signal and generating an output signal;
an additional trans-conductor circuit;
a tuning circuit increasing a voltage associated with said main trans-conductor circuit causing said integrated circuit to consume more power;
a comparator circuit comparing an amount of current in said integrated circuit with a reference current to determine whether said amount of current exceeds said reference current, wherein said comparator circuit performs said comparing in an analog form of said reference current and said current; and
a switch, responsive to the comparing of said comparator, connecting said additional trans-conductor circuit to said main trans-conductor circuit to reduce power consumed by said integrated circuit.

13. The integrated circuit of claim 12, wherein said tuning circuit decreases said voltage level after said adding, wherein said decreasing causes further reduction in power consumed by said integrated circuit.

14. The integrated circuit of claim 13, further comprising:
a replica trans-conductor circuit having a transfer characteristic similar to that of said main trans-conductor circuit, wherein said tuning circuit computes a trans-conductance value of said replica trans-conductor circuit and increases said voltage if said trans-conductance value is lower than a pre-specified value.

15. The integrated circuit of claim 14, wherein said tuning circuit increases said voltage level associated with said replica trans-conductor circuit also if said voltage level is increased for said main trans-conductor circuit.

16. The integrated circuit of claim 15, wherein said trans-conductor circuit is implemented using a MOS transistor, and said voltage comprises Von which equals ($V_1-V_3-V_T$), wherein '$V_1$' represents the voltage level at the gate terminal of the MOS transistor, '$V_3$' represents the voltage level at the drain terminal of the MOS transistor, and $V_T$ is a threshold voltage of the MOS transistor.

17. The integrated circuit of claim 16, wherein said trans-conductance value equals ($\mu*C_{OX}*W/L*V_{ON}$), '$\mu$' represents the mobility of holes/electrons in said MOS transistor, '$C_{OX}$' represents the channel capacitance of the transistor, 'W' represents the width of the MOS transistor, 'L' represents the length of the transistor, and * represents a multiplication operation.

18. The integrated circuit of claim 17, wherein the power consumed by said trans-conductor circuit equals ($\mu*C_{OX}*W/L*Von^2$).

19. A device comprising:
an integrated circuit comprising:
a main trans-conductor circuit receiving an input signal and generating an output signal;
an additional trans-conductor circuit;
a tuning circuit increasing a voltage associated with said main trans-conductor circuit causing said integrated circuit to consume more power;
a comparator circuit comparing an amount of current in said integrated circuit with a reference current to determine whether said amount of current exceeds said reference current, wherein said comparing is performed in an analog form of said reference current and said current; and
a switch, responsive to the comparing of said comparator, connecting said additional trans-conductor circuit to said main trans-conductor circuit to reduce power consumed by said integrated circuit.

20. The device of claim 19, further comprising:

an antenna receiving an external signal, wherein said input is generated based on said external signal;

a filter circuit comprising said integrated circuit, and generating said output;

an analog to digital converter converting said output to a plurality of digital samples; and a processing unit processing said plurality of digital samples.

21. The invention of claim 20, wherein said device comprises one of a mobile phone and a global positioning system receiver.

22. The device of claim 19, wherein said tuning circuit decreases said voltage level after said adding, wherein said decreasing causes further reduction in power consumed by said integrated circuit.

23. The device of claim 22, further comprising:

a replica trans-conductor circuit having a transfer characteristic similar to that of said main trans-conductor circuit, wherein said tuning circuit computes a trans-conductance value of said replica trans-conductor circuit and increases said voltage if said trans-conductance value is lower than a pre-specified value.

24. The device of claim 23, wherein said tuning circuit increases said voltage level associated with said replica trans-conductor circuit also if said voltage level is increased for said main trans-conductor circuit.

25. The device of claim 23, wherein said trans-conductor circuit is implemented using a MOS transistor, and said voltage comprises Von which equals $(V_1-V_3-V_T)$, wherein '$V_1$' represents the voltage level at the gate terminal of the MOS transistor, '$V_3$' represents the voltage level at the drain terminal of the MOS transistor, and $V_T$ is a threshold voltage of the MOS transistor.

26. The device of claim 24, wherein said trans-conductance value equals $(\mu^*C_{OX}^*W/L^*V_{ON})$, '$\mu$' represents the mobility of holes/electrons in said MOS transistor, '$C_{OX}$' represents the channel capacitance of the transistor, 'W' represents the width of the MOS transistor, 'L' represents the length of the transistor, and * represents a multiplication operation.

27. The device of claim 25, wherein the power consumed by said trans-conductor circuit equals $(\mu^*C_{OX}^*W/L^*Von^2)$.

* * * * *